United States Patent [19]

Marek

[11] Patent Number: 5,159,526

[45] Date of Patent: Oct. 27, 1992

[54] METHOD AND APPARATUS FOR DETERMINING ORIENTATION OF POLARIZED CAPACITORS

[75] Inventor: James E. Marek, Cypress, Tex.

[73] Assignee: Compaq Computer Corporation, Houston, Tex.

[21] Appl. No.: 811,327

[22] Filed: Dec. 20, 1991

[51] Int. Cl.$^5$ .................... H01G 4/00; G01R 31/02
[52] U.S. Cl. ..................... 361/301; 324/537
[58] Field of Search ............ 361/301; 324/51, 537

[56] References Cited

U.S. PATENT DOCUMENTS

| | | | |
|---|---|---|---|
| 3,851,243 | 11/1974 | Banner | 324/51 |
| 4,445,084 | 4/1984 | Washington | 324/51 |
| 4,918,392 | 4/1990 | Torres | 324/537 |

Primary Examiner—Donald Griffin
Attorney, Agent, or Firm—Vinson & Elkins

[57] ABSTRACT

The orientation of a polarized capacitor is determined by applying first and second signals to the inner and outer conducting plates of the capacitor, the first signal being out of phase with the second signal, such that the outer plate of the capacitor generates an external electric field responsive to its respective signal which is greater in magnitude than the external electric field generated by the first plate. The electric field is sensed proximate to the capacitor and a third signal is output responsive to the electric field. The phase of the third signal is used to determine the orientation of the capacitor.

19 Claims, 1 Drawing Sheet 5,159,526

METHOD AND APPARATUS FOR DETERMINING ORIENTATION OF POLARIZED CAPACITORS

TECHNICAL FIELD OF THE INVENTION

This invention is related in general to electronic circuits, and more particularly to a method and apparatus for in-circuit determination of the orientation of a polarized capacitor.

BACKGROUND OF THE INVENTION

A polarized capacitor has positive and negative terminals. In the design and fabrication of an electronic circuit, it is important to correctly orient each polarized capacitor. The result of misorienting a polarized capacitor can be damaging to the circuit and dangerous to individuals. First, the circuit failure due to the misoriented capacitor can be latent and unpredictable. Second, the resultant failure of the capacitor may be sudden and violent, causing physical damage to surrounding equipment and injury to personnel.

Heretofore, reliable determination of the orientation of a polarized capacitor by automatic means after connection of the capacitor into a circuit has been problematic. In general, no measurable parameter of the capacitor reliably indicates its orientation. While some polarized capacitors exhibit greater leakage current prior to failure when reverse-biased than when forward-biased, this phenomenon is not true of all polarized capacitors and is therefore not a reliable indicator of orientation. Also, for most circuits, only a limited amount of bias potential may be applied to a capacitor without having the measurement degraded by the effect of surrounding components in the circuit. Therefore, methods based on the leakage current are not universally applicable or reliable when performed in-circuit.

Currently, correct orientation of the capacitors can be ensured only by visual inspection, which is costly and error-prone. If circuit boards are not inspected, the danger of board failure or destruction exists.

Therefore, a need has arisen in the industry for a method and apparatus for in-circuit determination of the orientation of a polarized capacitor.

SUMMARY OF THE INVENTION

In accordance with the present invention, a method and apparatus is provided for determining the orientation of a capacitor while in a circuit.

The present invention includes circuitry for applying first and second signals to the inner and outer conducting plates of a capacitor, the first and second signals being out of phase. The net field external to the capacitor as a result of these signals will be of the same phase as the signal applied to the outer plate of the capacitor. This electric field is sensed and a third signal is generated in response thereto. The orientation of the capacitor with respect to the connected circuit is determined by inspecting the phase of the third signal.

The present invention provides significant advantages over the prior art by providing a highly accurate method and apparatus for determining the orientation of the capacitor while in-circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-5 of the drawings, like numerals being used for like and corresponding parts of the various drawings.

Figure 1:
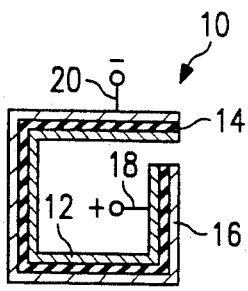
FIG. 1 illustrates a cross-sectional top view of the plates of a capacitor.

FIG. 1 illustrates a cross-sectional top view of the plates of a capacitor 10. The capacitor 10 comprises inner plate 12, dielectric 14, and outer plate 16. By convention, positive polarity lead 18 (or "terminal") is connected to inner plate 12 and negative polarity lead 20 is connected to outer plate 16.

In fabricating an electrolytic capacitor, an oxide coating (or other dielectric coating) is formed on a metal foil, typically an aluminum or tantalum foil. The oxide coating has a very small thickness, but a high dielectric constant, thereby creating a high capacitance in a small package. However, when the capacitor is reverse-biased (i.e., a substantial voltage is placed across the capacitor, opposite to its designed polarity) the dielectric may break down, resulting in the undesired consequences described herein.

Figure 2:
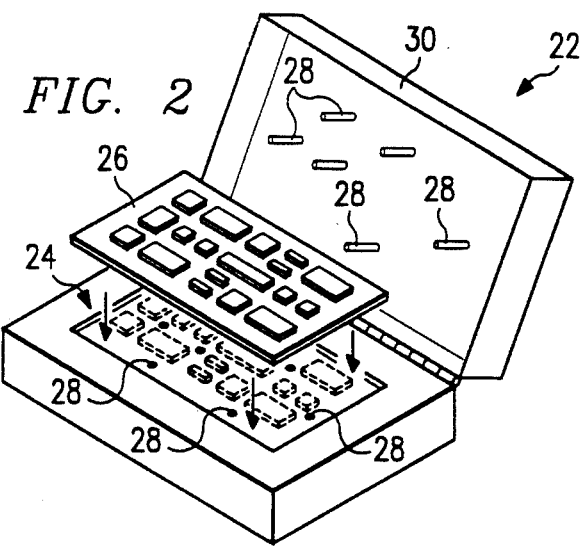
FIG. 2 illustrates a perspective view of a preferred embodiment of a board tester according to the present invention.

FIG. 2 illustrates a perspective view of a tester 22 used to verify the operation of a circuit board, including the correct orientation of the polarized capacitors in the circuit. The tester 22 comprises, in large part, the "bed of nails" testing circuitry typically used to input signals to various nodes on the circuit board and to monitor other signals to ensure correct operation of the circuit board. The tester 22 comprises an inlay region 24 in which the circuit board 26 rests in order to accurately align the bed of nails with the test points on the board. In addition to the conventional bed of nails, sensors 28 are provided above and below (if necessary) the circuit board 26, such that when the tester is enabled for testing (i.e., lid 30 is in a closed position) the ends of the sensors 28 will be in close proximity to the capacitors on the circuit board 26. In the preferred embodiment, a test controller (not shown) communicates with the tester 22 to provide instructions to the tester 22 and to analyze the results. The test controller is typically a programmable device.

Figure 3:
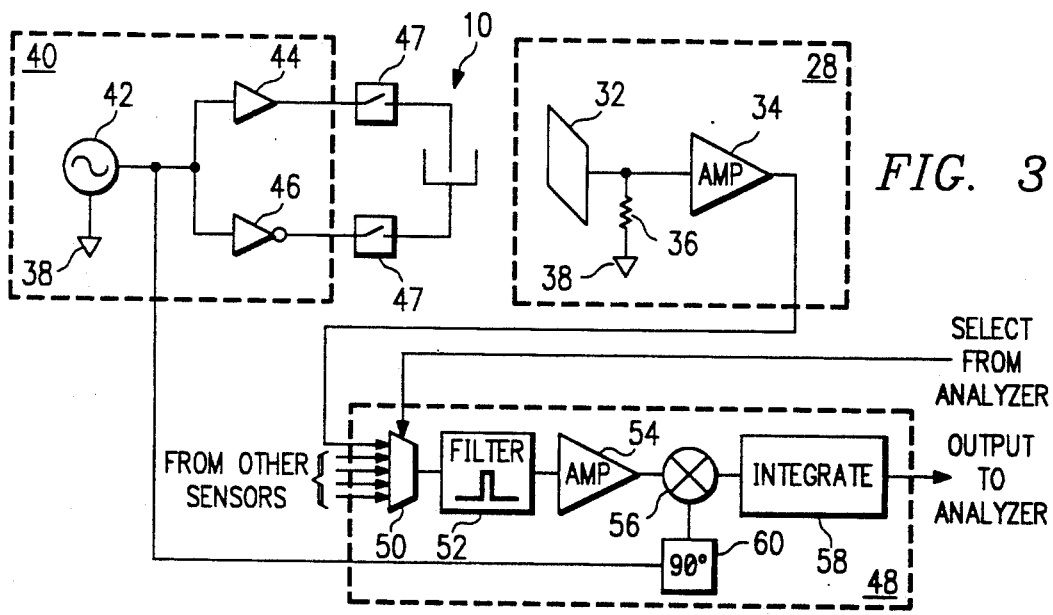
FIG. 3 illustrates a schematic representation of circuitry for determining the orientation of a capacitor.

FIG. 3 illustrates a schematic view of the circuitry used to test the orientation of the capacitors on the circuit board 26. This test is performed with the power to the circuit board disabled. The sensors 28 each comprise a sensing material 32 (or "plate"), coupled to an amplifier 34 and a resistor 36. The resistor 36 is coupled between the sensing plate 32 and ground. It should be noted that all of the testing circuitry is referenced to a common ground. The sensing material 32 typically comprises a metal plate, such as a copper plate. Preferably, the structure of the sensing plate allows trimming the plate to a desired size. The amplifier 34 may be a field-effect transistor, which may be mounted on the sensing plate 32, having its gate driven by the signal on the sensing plate 32. The resistor 36 is typically a 10 megohm resistor; the purpose of the resistor is to provide biasing for the amplifier 34 and for producing a predictable phase shift.

Signal generation circuitry 40 comprises a signal generator 42 (typically a sine wave generator) coupled to amplifier 44 and inverting amplifier 46. The output of amplifier 44 is coupled to one terminal of capacitor 10, and the output of inverting amplifier 46 is coupled to the other terminal of capacitor 10. At the time of the testing, the polarity of the respective terminals of capacitor 10 are unknown.

In the preferred embodiment, signal generator 42 outputs a sine wave having a typical frequency of 100 Hz. Two considerations are important in choosing a frequency for the signal generator: (1) frequencies close to the frequency of the power signals input to the tester 22 (e.g., a power line frequency of 60 Hz) should be avoided and (2) lower frequencies will facilitate testing of larger capacitance at the expense of larger times required for integration of the detected signal. The magnitude of the sine wave signal at the capacitor terminals is typically set to approximately 0.2 volts, so that the effect of surrounding circuitry is minimized, and so that the capacitor under test is not severely reverse-biased during the test.

The outputs of the amplifier 44 and inverting amplifier 46 will normally be coupled to respective plates of other capacitors via scanning relays 47 (or by solid state relays), such that the input test signals from the signal generation circuitry 40 may be input to a selected capacitor on a circuit board without duplicating the signal generation circuitry 40.

In operation, the signal generator 42 provides the leads of the capacitor 10 (via the bed of nails) with signals that are 180° out of phase with one another. The plates of the capacitor 10 will generate electric fields responsive to the signals; however, the signal applied to the outer plate 16 will be predominant in the area surrounding the capacitor. The sensing plate 32 is capacitively coupled to the plates of capacitor 10 (albeit weakly) and will thus be influenced by their electric fields, predominantly the electric field of the outer plate 16.

The voltage of the sensing plate 32 will thus vary with the signal on the outer plate 16. The phase of the voltage signal on the sensing plate will be shifted by almost 90° due to the effect of typical practical circuit values. The amplifier 34 provides a typical gain of 100 to the signal from the sensing plate 32.

The output of each sensor 28 is coupled to phase detection circuitry 48 along with the output from the signal generator 42. In the preferred embodiment, phase detection circuitry 48 includes a multiplexer 50 which selects one signal from the plurality of sensors 28. The test controller provides a signal to the multiplexer 50 to select a desired sensor for testing. The output of the multiplexer 50 is input to a filter 52 which passes a desired frequency. The output of the filter 52 is amplified by amplifier 54 and the amplified signal is received by phase detector 56. The output of phase detector 56 is received by integrator 58. The output of the signal generator 42 is passed through a phase shift circuit 60. The output of phase shift circuit 60 controls the state of phase detector 56. The output of integrator 58 is coupled to the test controller.

Filter 52 passes a predetermined range of frequencies centered about the frequency of the signal output from signal generator 42 and rejects all other frequencies. In the preferred embodiment, filter 52 comprises a 4th order Butterworth band pass filter, however, other filters may also be acceptable. Importantly, the filter must have a high stop band rejection characteristic, and should not introduce any appreciable phase shift into the signal output from multiplexer 50. Additionally, it is important that the frequency output from the signal generator 42 be centered to the pass band frequency of filter 52. Therefore, in the preferred embodiment, switched capacitor filters are used both to derive the signal of generator 42 and to set the center frequency of the filter from a common clock signal, so that the filter 52 tracks the generator frequency automatically, without the need for precision components.

The output of filter 52 is therefore the 100 Hz signal output from the sensor 28. This signal is input to amplifier 54, which has typical gain of several thousand to provide a convenient signal output level. Typically, amplifier 54 comprises one or more operational amplifiers.

In the preferred embodiment, phase detector 56 is a synchronous detector and, in conjunction with phase shifter 60, inverts a portion of the signal output by amplifier 54 responsive to the relative phases of the signals from the sensor 28 and the phase-shifted signal from the signal generator 42. If the two signals are in phase, the negative portion of the sine wave output from amplifier 54 is inverted, thereby producing the positive waveform shown in FIG. 4a. If the signal output from sensor 28 is out of phase with the signal from the phase shifter 60 (i.e., the output of inverting amplifier 46 is coupled to outer plate 16 of capacitor 10), then the positive portion of the output of amplifier 54 is inverted, resulting in the negative waveform of FIG. 4b.

Figure 4A:
FIGS. 4a-b illustrate signal diagrams of signals output from the phase detector of FIG. 3.
Figure 4B:
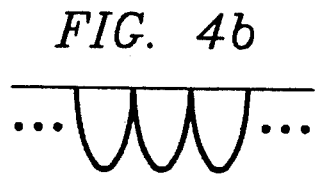

In operation, in the preferred embodiment, the phase detector 56 works as follows. As previously discussed, the capacitive coupling between the sensing plate 32 and the outer plate 16 of capacitor 10 will result in a phase shift of approximately 90° relative to the voltage signal on the outer plate 16. To compensate for this phase shift, the output of signal generator 42 is also shifted by 90°. The output of amplifier 54 is inverted during one-half of the signal cycle. Hence, if the signals are aligned, the output of phase detector 56 will be all positive and, as shown in FIG. 4a, if the signals are out of phase by 180°, the output of phase detector 56 will be all negative as shown in FIG. 4b. Other methods of phase detection may be similarly used, as would be known to one skilled in the art.

Figure 5B:
FIGS. 5a-b illustrate signal diagrams of the output of the integrator circuitry of FIG. 3.
Figure 5A:
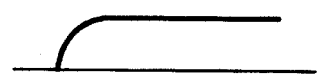

Integrator 58 receives the output from phase derector 56 and provides a high or low signal responsive thereto. This output is sent to the test controller which will then determine whether the orentation of the capacitor is correct (output of integrator positive) or incorrect (output of integrator negative). The waveforms for correct and incorrect orientations are shown in FIGS. 5a-b, respectively.

The multiplexer 50 allows the output of a plurality of sensors 28 to be analyzed in succession. In order to allow the signals to stabilize, an appropriate settling time, typically 50 milliseconds, should be allowed for each capacitor. If a capacitor is incorrectly oriented in the circuit board, the analyzer may output a message such as "C23 polarity reversed". If a capacitor has positive and negative leads opposite to convention (i.e., the outer plate 16 is the positive plate), this can be accounted for by the analyzer as specific cases warrant. Testing of multiple capacitors could also be performed manually, using a mechanical switch to make connections to the capacitors; an LED could indicate whether the selected capacitor was correctly oriented.

Capacitors connected in parallel may be tested individually by the present invention. However, if capacitors are located close together, whether or not connected in parallel, the sensors 28 should be placed such that they are located away from adjacent capacitors.

While not shown in FIG. 3, the preferred embodiment includes a self-test feature which allows the phase detection circuitry 48 to be tested prior to actual testing. The capacitive coupling between the capacitor 10 and the sensing plate 32 may be simulated using an appropriate ratio of capacitance and resistance to produce the proper signal amplitude and phase shift.

The present invention provides significant advantages over the prior art. The orientation of a polarized capacitor can be accurately determined while the capacitor is connected to other circuitry. A plurality of capacitors on a circuit board may be tested quickly in an automated process. Further, the present invention works with many different capacitor structures.

Although the present invention and its advantages have been described in detail, it should be understood that various changes, substitutions and alterations can be made herein without departing from the spirit and scope of the invention as defined by the appended claims.

What is claimed is:

1. Circuitry for in-circuit determination of the orientation of a capacitor having first and second conducting plates, comprising:
   circuitry for applying first and second signals to the first and second plates of the capacitor, said first signal being out of phase with the second signal, such that the second plate of the capacitor generates an external electric field responsive to the signal applied thereto which is greater in magnitude than the external electric field generated by the signal applied to the first plate;
   circuitry for sensing the electric field proximate to the capacitor and outputting a third signal in response thereto; and
   circuitry for determining the orientation of the capacitor responsive to the phase of the third signal.

2. The circuitry of claim 1 wherein said first and second signals are of opposite phase.

3. The circuitry of claim 2 wherein said circuitry for applying first and second signals comprises:
   a signal generator for outputting a predetermined signal; and
   an inverting amplifier coupled to said signal generator for generating the inverse of said predetermined signal.

4. The circuitry of claim 3 wherein said determining circuitry comprises filtering circuitry coupled to the sensing circuitry for filtering said third signal.

5. The circuitry of claim 4 wherein said filtering circuitry passes a predetermined band of frequencies and stops other frequencies.

6. The circuitry of claim 4 wherein said determining circuitry further comprises circuitry for generating an output voltage signal polarity dependent on the phase of the filtered third signal relative to the generated predetermined signal.

7. The circuitry of claim 9 wherein said determining circuitry further comprises circuitry for integrating the output voltage signal.

8. The circuitry of claim 1 wherein said sensing circuitry comprises a conducting plate.

9. The circuitry of claim 8 wherein said sensing circuitry further comprises an amplifier coupled to said conducting plate.

10. The circuitry of claim 9 wherein said sensing circuitry further comprises a resistive element coupled between said metal plate and ground.

11. A method for in-circuit determination of the orientation of a capacitor having first and second conducting plates, comprising:
    applying first and second signals to the first and second plates of the capacitor, said first signal being out of phase relative to the second signal, such that the second plate of the capacitor generates an electric field responsive to the signal applied thereto which is greater in magnitude than the electric field generated by the signal applied to the first plate;
    sensing the electric field proximate to the capacitor and outputting a third signal in response thereto; and
    determining the orientation of the capacitor responsive to the phase of said third signal.

12. The method of claim 11 wherein said applying step comprises the step of applying first and second signals which are of opposite phase.

13. The method of claim 12 wherein said applying step comprises:
    outputting a predetermined signal and applying said predetermined signal to one of the first and second plates; and
    generating the inverse of said predetermined signal and applying the inverted signal to the other of said first and second plates.

14. The method of claim 13 wherein said determining step includes the step of filtering said third signal.

15. The method of claim 14 wherein said filtering step comprises passing a predetermined band of frequencies of said third signal and stopping other frequencies.

16. The method of claim 14 wherein said determining step further comprises the step of generating an output voltage signal polarity dependent on the phase of the filtered third signal relative to the generated predetermined signal.

17. The method of claim 16 wherein said determining step further comprises the step of integrating the output voltage signal.

18. The method of claim 11 wherein said sensing step comprises sensing the electric field with a conducting plate proximate to said capacitor.

19. The method of claim 18 wherein said sensing step further comprises amplifying the signal on the conducting plate.

* * * * *